United States Patent
Kanehiro et al.

(10) Patent No.: US 12,520,654 B2
(45) Date of Patent: Jan. 6, 2026

(54) DISPLAY DEVICE AND DISPLAY DEVICE PRODUCTION METHOD

(71) Applicant: Sharp Kabushiki Kaisha, Sakai (JP)

(72) Inventors: Masayuki Kanehiro, Sakai (JP); Hisayuki Utsumi, Sakai (JP); Hiroki Imabayashi, Sakai (JP)

(73) Assignee: SHARP KABUSHIKA KAISHA, Sakai (JP)

( * ) Notice: Subject to any disclaimer, the term of this patent is extended or adjusted under 35 U.S.C. 154(b) by 567 days.

(21) Appl. No.: 17/922,012

(22) PCT Filed: May 21, 2020

(86) PCT No.: PCT/JP2020/020058
§ 371 (c)(1),
(2) Date: Oct. 28, 2022

(87) PCT Pub. No.: WO2021/234893
PCT Pub. Date: Nov. 25, 2021

(65) Prior Publication Data
US 2023/0180496 A1    Jun. 8, 2023

(51) Int. Cl.
*H10K 50/115* (2023.01)
*C09K 11/08* (2006.01)
(Continued)

(52) U.S. Cl.
CPC ............ *H10K 50/115* (2023.02); *C09K 11/08* (2013.01); *H05B 33/10* (2013.01); *H05B 33/12* (2013.01);
(Continued)

(58) Field of Classification Search
CPC ...... H10K 50/115; H10K 50/14; H10K 50/15; H10K 50/155; H10K 50/156; H10K 59/352; H10K 59/871; H10K 59/8722
See application file for complete search history.

(56) References Cited

U.S. PATENT DOCUMENTS 10,388,902 B1    8/2019    Palles-Dimmock et al.
2012/0248410 A1*  10/2012   Murayama ........ H01L 21/02422
                                              257/E33.001
(Continued)

FOREIGN PATENT DOCUMENTS

| CN | 205177887 U | * | 4/2016 | ............. H01L 51/50 |
| JP | 2009088276 A | * | 4/2009 | ............. H10K 51/10 |
| JP | 2012-234748 A | | 11/2012 | |

OTHER PUBLICATIONS

Machine translation, Shimogawara, Japanese Pat. Pub. No. JP2009088276A, translation date: May 1, 2025, Espacenet, all pages. (Year: 2025).*

(Continued)

*Primary Examiner* — Victoria K. Hall
(74) *Attorney, Agent, or Firm* — Keating & Bennett, LLP

(57) ABSTRACT

A display device has a light-emitting element layer including a plurality of light-emitting elements each of which includes a first electrode, a function layer, and a second electrode, and that emit mutually different colors of light. The function layer includes a first hole transport layer, a light-emitting layer provided on the first hole transport layer, and an electron transport layer provided on the light-emitting layer. The first hole transport layer contains a hole transport material, and the light-emitting layer contains a quantum dot and a ligand coordinating with the quantum dot. The first hole transport layer contains the quantum dot coordinating with the ligand, and the ligand coordinates with the quantum dot so as to prevent the hole transport material from being exposed to the light-emitting layer.

13 Claims, 11 Drawing Sheets

(51) Int. Cl.
- *H05B 33/10* (2006.01)
- *H05B 33/12* (2006.01)
- *H05B 33/14* (2006.01)
- *H05B 33/22* (2006.01)
- *H10K 50/15* (2023.01)
- *H10K 59/12* (2023.01)
- *H10K 71/00* (2023.01)

(52) U.S. Cl.
CPC ............. *H05B 33/14* (2013.01); *H05B 33/22* (2013.01); *H10K 50/156* (2023.02); *H10K 59/1201* (2023.02); *H10K 59/12* (2023.02)

(56) References Cited

U.S. PATENT DOCUMENTS

| | | | |
|---|---|---|---|
| 2013/0216707 A1* | 8/2013 | Bulovic | B05D 7/52 427/404 |
| 2019/0245017 A1* | 8/2019 | Jeon | H10K 59/8792 |
| 2019/0305241 A1 | 10/2019 | Angioni et al. | |

OTHER PUBLICATIONS

Machine translation, Chen, Chinese Pat. Pub. No. CN205177887U, translation date: May 1, 2025, Espacenet, all pages. (Year: 2025).*

International Searching Authority, Written Opinion of the International Searching Authority, International application No. PCT/JP2020/020058, Jul. 7, 2020, all pages. (Year: 2020).*

International Searching Authority, International Search Report, International application No. PCT/JP2020/020058, Jul. 7, 2020, all pages. (Year: 2020).*

S. Coe-Sullivan et al., Large-Area Ordered Quantum-Dot Monolayers via Phase Separation During Spin-Casting, first published Apr. 13, 2005, Advanced Functional Materials, vol. 15, No. 7 (Jul. 2005), pp. 1117-1124. (Year: 2005).*

Official Communication issued in International Patent Application No. PCT/JP2020/020058, mailed on Jul. 7, 2020.

* cited by examiner (a)

(b)

(a)

(b)

(a)

(b)

(c)

DISPLAY DEVICE AND DISPLAY DEVICE PRODUCTION METHOD

TECHNICAL FIELD

The disclosure relates to a display device and a method for manufacturing the display device.

BACKGROUND ART

The development and commercialization of self-emission display devices has been recently pursued instead of non-self-emission liquid crystal displays. Such display devices that require no backlight devices have a light-emitting element, such as an organic light-emitting diode (OLED) or a quantum-dot light-emitting diode (QLED), provided for each pixel.

Further, such a self-emission display device as described above includes a first electrode, a second electrode, and a function layer located between the first electrode and the second electrode and including at least a light-emitting layer. Furthermore, in such display devices, a proposal has been made that includes, for instance, forming at least one layer included in the function layer, e.g., a light-emitting layer with a liquid-drop method, such as spin coating or ink-jet application, rather than with an already existing evaporation method in order to manufacture high-definition display devices inexpensively and easily (see Patent Literature 1 for instance).

CITATION LIST

Patent Literature

Patent Literature 1: Japanese Unexamined Patent Application Publication No. 2012-234748

SUMMARY

Technical Problem

By the way, in such a known display device and method for manufacturing the display device as described above, the light-emitting layer is formed by, for instance, dropping or applying a solution (droplets) containing a functional material (i.e., a light-emitting material) of the light-emitting layer.

Unfortunately, in such a known display device and method for manufacturing the display device as described above, a light-emitting layer having an appropriate thickness cannot be formed accurately in some cases, due to a coffee ring effect that occurs when the light-emitting layer is formed. In particular, for forming a light-emitting layer containing quantum dots in a known display device and method for manufacturing the display device, the thickness of the light-emitting layer is formed by the nanometer; hence, when, for instance, the quantum dots are distributed non-uniformly within the light-emitting layer, the hole transport material for instance within a hole transport layer, stacked under the light-emitting layer, is exposed to the light-emitting layer in some cases. Consequently, the exposed hole transport material in some cases comes into electrical contact (leakage) with the electron transport material of an electron transport layer, provided opposite the hole transport layer of the light-emitting layer, and/or the cathode material within the electron transport layer, serving also as a cathode, thus possibly causing leakage between these hole transport material and electron transport material and/or cathode material. As a result, in the known display device and method for manufacturing the display device, the quantum dots within the light-emitting layer do not emit light, thus unfortunately lowering the light emission efficiency of the display device to degrade the display performance of the display device.

In view of the above problem, the disclosure aims to provide a display device and a method for manufacturing the display device that can prevent degradation in display performance even when a light-emitting layer is formed using a drop method.

Solution to Problem

To achieve the above object, a display device according to the disclosure is a display device provided with a display region having a plurality of pixels, and a frame region surrounding the display region, the display device including:
  a thin-film transistor layer; and
  a light-emitting element layer including a plurality of light-emitting elements each including a first electrode, a function layer, and a second electrode, the plurality of light-emitting elements being configured to emit mutually different colors of light,
  wherein the function layer includes a first hole transport layer, a light-emitting layer provided on the first hole transport layer, and an electron transport layer provided on the light-emitting layer,
  the first hole transport layer contains a hole transport material,
  the light-emitting layer contains a quantum dot and a ligand coordinating with the quantum dot,
  the first hole transport layer contains the quantum dot coordinating with the ligand, and
  the ligand coordinates with the quantum dot so as to prevent the hole transport material from being exposed to the light-emitting layer.

In the display device configured in the foregoing manner, the quantum dot and the ligand coordinating with the quantum dot are contained in the light-emitting layer. Further, the first hole transport layer contains the hole transport material and the quantum dot coordinating with the ligand. Furthermore, the ligand coordinates with the quantum dot at the interface between the light-emitting layer and the first hole transport layer so as to prevent the hole transport material from being exposed to the light-emitting layer. This can prevent electrical contact (leakage) with the hole transport material adjacent to the electron transport layer even when the light-emitting layer is formed using a drop method. As a result, a display device that can prevent degradation in display performance can be configured.

Further, a method for manufacturing a display device according to the disclosure is a method for manufacturing a display device provided with a display region having a plurality of pixels, and a frame region surrounding the display region, the display device being provided with a thin-film transistor layer, and a light-emitting element layer including a plurality of light-emitting elements each including a first electrode, a function layer and a second electrode, the plurality of light-emitting elements being configured to emit mutually different colors of light, the method comprising:
  a mixed solution forming step of forming a mixed solution that contains a hole transport material and a quantum dot coordinating with a ligand;

a mixed solution dropping step of dropping the mixed solution over the first electrode;

a phase separation step of subjecting a first hole transport layer and a light-emitting layer to phase separation from the mixed solution dropped, the first hole transport layer containing the hole transport material and the quantum dot coordinating with the ligand, the light-emitting layer being provided on the first hole transport layer and containing only the quantum dot coordinating with the ligand;

an exposure step of exposing the first hole transport layer and the light-emitting layer through irradiation with predetermined light; and a patterning step of patterning the first hole transport layer and the light-emitting layer individually into a predetermined shape by subjecting the first hole transport layer and the light-emitting layer to development using a predetermined developing solution.

In the method for manufacturing the display device configured in the foregoing manner, the mixed solution forming step includes forming a mixed solution that contains a hole transport material and a quantum dot coordinating with a ligand. Further, the mixed solution dropping step includes dropping the mixed solution over the first electrode. Further, the dropped solution undergoes the phase separation step, exposure step and patterning step sequentially. This can prevent electrical contact (leakage) with the hole transport material adjacent to the electron transport layer. As a result, degradation in the display performance of the display device can be prevented.

Advantageous Effect of Disclosure

Degradation in display performance can be prevented even when a light-emitting layer is formed using a drop method.

BRIEF DESCRIPTION OF DRAWINGS

FIG. 7(a) and FIG. 7(b) respectively illustrate how a light-emitting layer and a hole transport layer are formed in the comparative example and how a light-emitting layer and a hole transport layer are formed in the device according to this embodiment.

FIG. 9(a) is a perspective view of a specific configuration of a second electrode in the second modification, FIG. 9(b) illustrates a specific configuration of a light-emitting element layer in the second modification, and FIG. 9(c) is a graph showing an effect in the second modification.

DESCRIPTION OF EMBODIMENTS

The embodiments of the disclosure will be detailed based on the drawings. It is noted that the disclosure is not limited to the following embodiments. Moreover, the term "in the same layer" hereinafter refers to that one layer is formed in the same process step (film formation step) as another layer, the term "under" hereinafter refers to that one layer is formed in a process step anterior to a process step of forming a comparative layer, and the term "over" hereinafter refers to that one layer is formed in a process step posterior to a process step of forming a comparative layer. Moreover, the sizes of components within each drawing do not truly reflect their actual sizes, the actual ratio of size of the components, and other things.

First Embodiment

Figure 1:
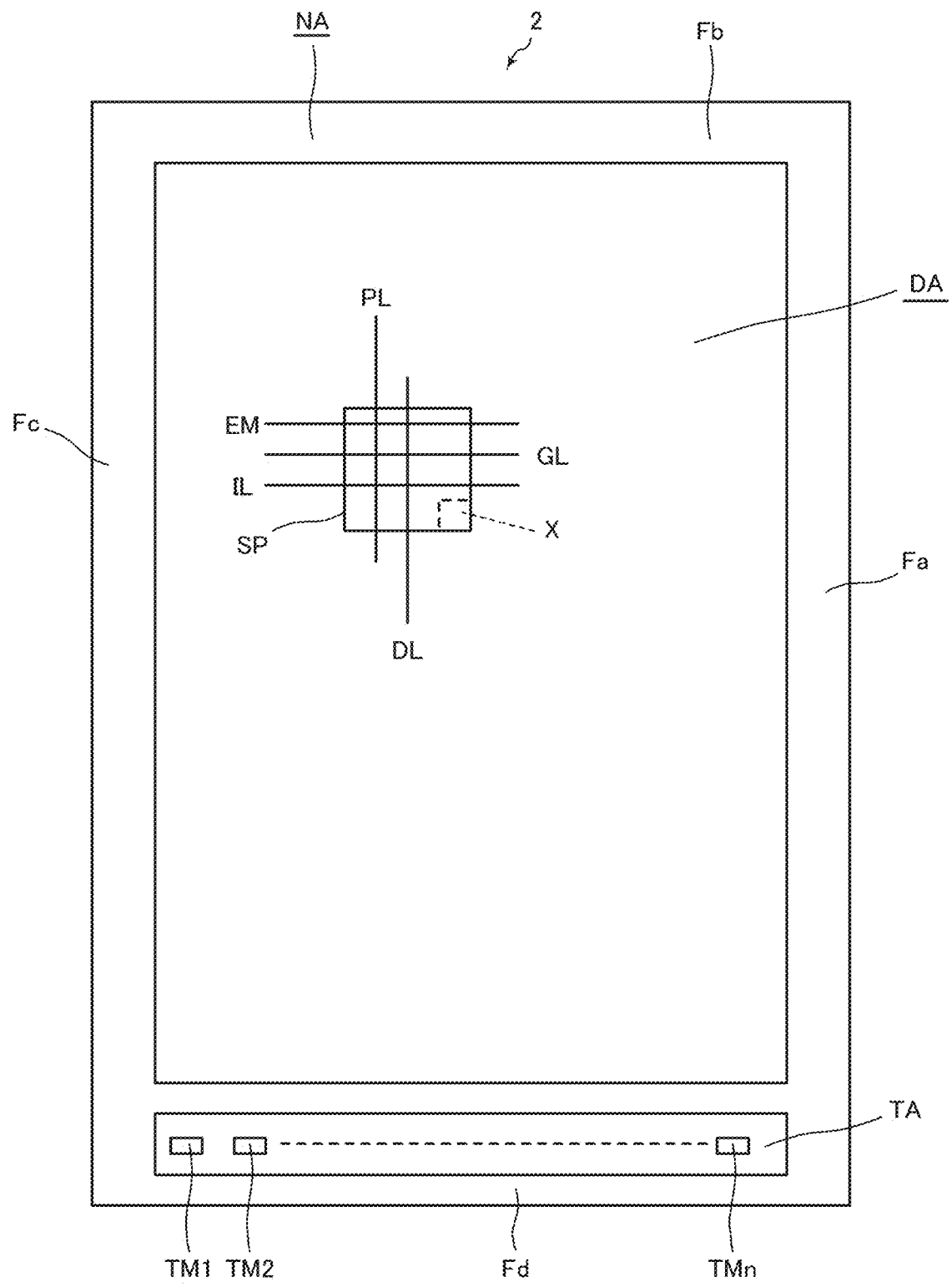
FIG. 1 is a schematic diagram of a configuration of a display device according to a first embodiment of the disclosure.
Figure 2:
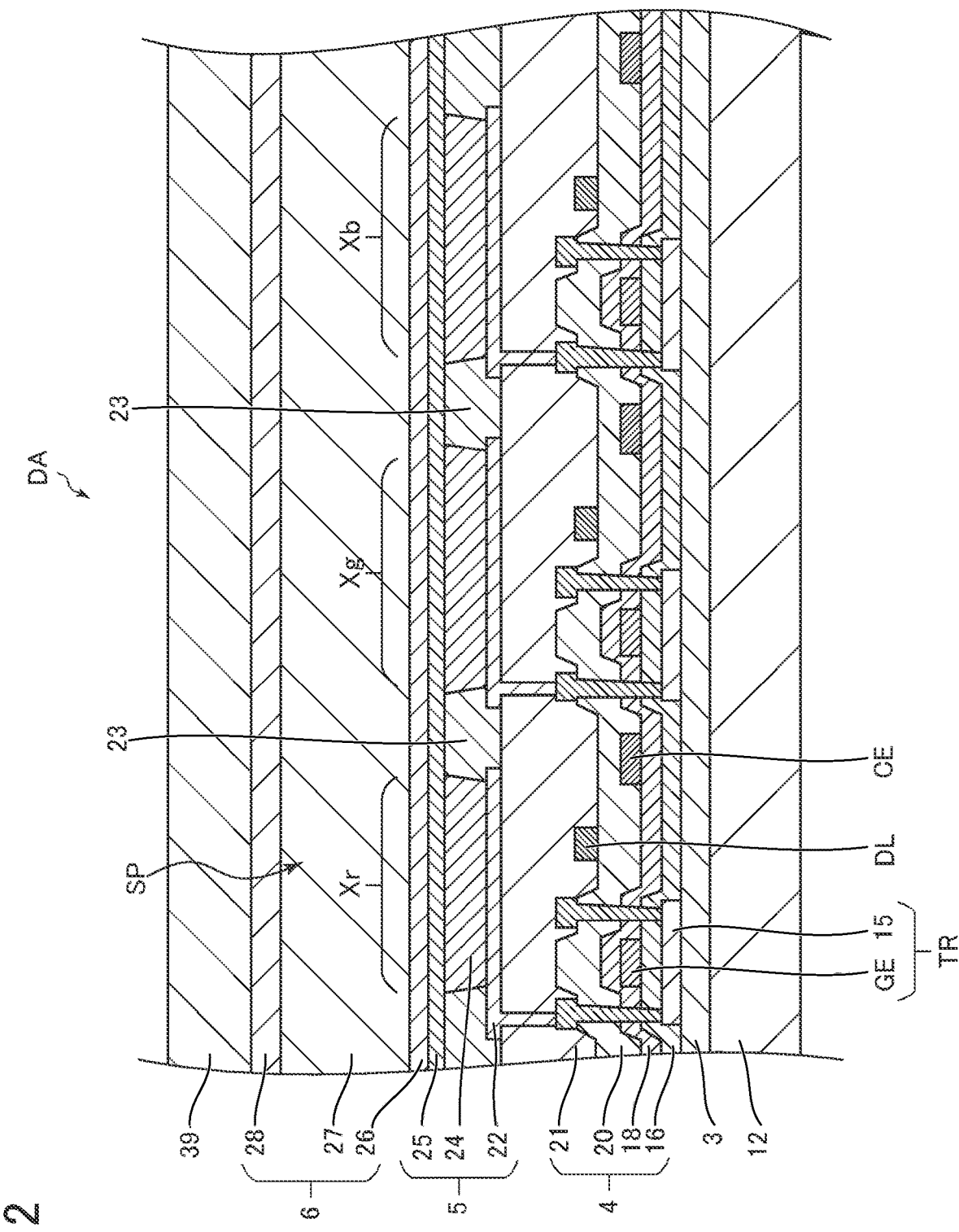
FIG. 2 is a sectional view of main components of the display device illustrated in FIG. 1.

FIG. 1 is a schematic diagram of a configuration of a display device according to a first embodiment of the disclosure. FIG. 2 is a sectional view of main components of the display device illustrated in FIG. 1. FIG. 3(a) illustrates a specific configuration of a function layer illustrated in FIG. 2, and FIG. 3(b) illustrates a quantum dot contained in a light-emitting layer illustrated in FIG. 3(a). FIG. 4 is a sectional view of a specific example configuration of a light-emitting element illustrated in FIG. 2.

As illustrated in FIG. 1 and FIG. 2, a display device 2 according to this embodiment has a base 12, on which a barrier layer 3, a thin-film transistor (TFT) layer 4, a top-emission light-emitting element layer 5, and a sealing layer 6 are provided in this order, and the display device 2 has a plurality of subpixels SP formed in a display region DA. A frame region NA, surrounding the display region DA, consists of four side edges Fa to Fd, among which the side edge Fd is provided with a terminal section TA formed for mounting electronic circuit boards (e.g., an IC chip and an FPC). The terminal section TA includes a plurality of terminals TM1, TM2, and TMn (n is an integer equal to or greater than two). The plurality of terminals TM1, TM2, and TMn are provided along one of the four sides of the display region DA, as illustrated in FIG. 1. It is noted that a driver circuit (not shown) can be formed at each of the side edges Fa to Fd.

The base 12 may be a glass substrate, or a flexible substrate including a film of resin, such as polyimide. Further, the base 12 can constitute a flexible substrate using two resin films and an inorganic insulating film interposed between the resin films. Furthermore, a film, such as a PET film, may be attached on the lower surface of the base 12. Further, the display device 2 having flexibility, that is, a flexible display device 2 can be formed when a flexible substrate is used as the base 12.

The barrier layer 3 protects the thin-film transistor layer 4 and light-emitting element layer 5 from intrusion of foreign substances, including water and oxygen, and can be composed of, for instance, a silicon oxide film, a silicon nitride film, or a silicon oxide nitride film, all of which are formed through CVD, or a laminated film of these materials.

As illustrated in FIG. 2, the thin-film transistor layer 4 includes a semiconductor layer (including a semiconductor film 15) over the barrier layer 3, an inorganic insulating film 16 (gate insulating film) over the semiconductor layer, a first metal layer (including a gate electrode GE) over the inorganic insulating film 16, an inorganic insulating film 18 over the first metal layer, a second metal layer (including a capacitive electrode CE) over the inorganic insulating film 18, an inorganic insulating film 20 over the second metal layer, a third metal layer (including a data signal line DL) over the inorganic insulating film 20, and a flattening film 21 over the third metal layer.

The semiconductor layer is composed of, for instance, amorphous silicon, low-temperature polysilicon (LTPS), or an oxide semiconductor, and the gate electrode GE and the semiconductor film 15 together constitute a thin-film transistor TR.

It is noted that this embodiment has described a thin-film transistor TR of a top-gate type by way of example, the thin-film transistor TR may be a bottom-gate thin-film transistor.

The display region DA includes a light-emitting element X and a circuit for controlling the light-emitting element X, both of which are provided for each subpixel SP, and the thin-film transistor layer 4 includes these control circuits and wires connected to them. Examples of the wires connected to the control circuit include, but not limited to, a scan signal line GL and a light-emission control line EM, both formed in the first metal layer, an initialization power-source line IL, provided in the second metal layer, and the data signal line DL and a high-voltage power-source line PL, both provided in the third metal layer. The control circuit includes, but not limited to, a drive transistor that controls a current that flows through the light-emitting element X, a write transistor electrically connected to the scan signal line, and a light-emission control transistor electrically connected to the light-emission control line.

The first metal layer, the second metal layer, and the third metal layer are composed of a monolayer or multilayer film of metal including at least one of, for instance, aluminum, tungsten, molybdenum, tantalum, chromium, titanium, and copper.

The inorganic insulating films 16, 18, and 20 can be composed of, for instance, a silicon oxide (SiOx) film or a silicon nitride (SiNx) film, both of which are formed through CVD, or can be composed of, for instance, a laminate of these films. The flattening film 21 can be made of an organic material that can be applied, such as polyimide or acrylic resin.

The light-emitting element layer 5 includes a first electrode (anode) 22 over the flattening film 21, an insulating edge cover film 23 covering the edge of the first electrode 22, a function layer 24 over the edge cover film 23, and a second electrode (cathode) 25 over the function layer 24. That is, the light-emitting element layer 5 includes a plurality of light-emitting elements X each including the first electrode 22, a light-emitting layer (described later on) included in the function layer 24, and the second electrode 25, and the plurality of light-emitting elements X emit mutually different colors of light. The edge cover film 23 is formed by, for instance, applying an organic material, such as polyimide or acrylic resin, followed by patterning through photolithography. Further, the edge cover film 23 overlaps the end of a surface of the first electrode 22, which is in the form of an island, to define a pixel (subpixel SP) and is a bank partitioning a plurality of individual pixels (subpixels SP) in correspondence with the plurality of respective light-emitting elements X. Further, the function layer 24 is an electroluminescence (EL) layer containing electroluminescence elements.

The light emitter layer 5 includes a light-emitting element Xr (red), a light-emitting element Xg (green), and a light-emitting element Xb (blue) all included in the light-emitting elements X and designed to emit mutually different colors of light. Further, each light-emitting element X includes the first electrode 22, the function layer 24 (including the light-emitting layer), and the second electrode 25. The first electrode 22 is an electrode in the form of an island provided for each light-emitting element X (i.e., the subpixel SP). The second electrode 25 is a flat electrode common to all the light-emitting elements X.

The light-emitting elements Xr, Xg, and Xb are, for instance, quantum-dot light-emitting diodes (QLEDs) each including the foregoing light-emitting layer, which is herein a quantum-dot light-emitting layer.

The function layer 24 is composed of a stack of, for instance, a hole injection layer 24a, a first hole transport layer 24b, a light-emitting layer 24c, an electron transport layer 24d, and an electron injection layer 24e in sequence from the bottom, as illustrated in FIG. 3(a). Further, the function layer 24 may include an electron blocking layer or a hole blocking layer. The first hole transport layer 24b and the light-emitting layer 24c are, as described later on, dropped onto the hole injection layer 24a through a drop method, where a mixed solution is dropped, and the first hole transport layer 24b and the light-emitting layer 24c undergo phase separation and are then formed in the form of an island in the opening (for each subpixel SP) of the edge cover film 23. The other layers are formed in the form of an island or in a flat manner (common layers). The function layer 24 can have a configuration where one or more of the hole injection layer 24a, the electron transport layer 24d and the electron injection layer 24e are not formed.

Further, the light-emitting layer 24c contains quantum dots (semiconductor nanoparticles) 50, as illustrated in FIG. 3(b). Each quantum dot 50 has a core-shell structure having, for instance, a core 51 and a shell 52, which is the outer shell of the core 51. Furthermore, each quantum dot 50 coordinates with ligands 53 each having a long-chain portion 53a and a coordinating portion 53b. Moreover, the ligands 53 coordinate with the quantum dot 50 so as to prevent the hole transport material, which will be described later on, within the first hole transport layer 24b from being exposed to the light-emitting layer 24c. Specific materials of the quantum dot 50 and ligands 53 will be described later on.

Further, the quantum dots 50 are light-emitting materials having a valence band level and a conduction band level, and designed to emit light upon rejoining between holes of the valence band level and electrons of the conduction band level, and the quantum dots 50 are each a single phosphor particle without visible-light scattering. Light emitted from the quantum dots 50 has a narrow spectrum due to a quantum confinement effect, and hence, light emission of relatively deep chromaticity can be achieved.

Further, the core 51 of each quantum dot 50 has a particle diameter of about 1 to 15 nm. The wavelength of light emitted from the quantum dots 50 can be controlled by the particle diameter of the cores 51. Hence, controlling the particle diameter of the cores 51 can regulate the wavelength of light emitted by the display device 2.

The display device 2 according to this embodiment has a known structure, where, as illustrated in FIG. 2, the anode (first electrode 22), the function layer 24, and the cathode (second electrode 25) are provided sequentially on the thin-film transistor layer 4.

Further, as illustrated in FIG. 4, the light-emitting elements Xr, Xg and Xb of the display device 2 according to this embodiment are partitioned by the edge cover film 23, which is a bank, and for each light-emitting element X, the first electrode 22 in the form of an island, the hole injection layer 24*a* in the form of an island, the first hole transport layer 24*b* in the form of an island, and light-emitting layers 24*cr*, 24*cg* and 24*cb* (generically referred to as the light-emitting layer 24*c*) in the form of islands are provided. Further, the electron transport layer 24*d* in a flat manner, the electron injection layer 24*e* in a flat manner, and the second electrode 25 in a flat manner, all of which are common to all the subpixels SP, are provided in the light-emitting element X.

Further, in the light-emitting layer 24*c*, a drive current between the first electrode 22 and the second electrode 25 causes a hole and an electron to rejoin together within the light-emitting layer 24*c*, thus generating an exciton, and the exciton emits light (fluorescent light) in the process of transition from the conduction band level of the quantum dot 50 to the valence band level of the quantum dot 50.

Further, the following describes an instance where in the display device 2 according to this embodiment, the red light-emitting element Xr includes a red quantum-dot light-emitting layer that emits red light, the green light-emitting element Xg includes a green quantum-dot light-emitting layer that emits green light, and the blue light-emitting element Xb includes a blue quantum-dot light-emitting layer that emits blue light.

The quantum-dot light-emitting layers (light-emitting layer 24*c*) contain the quantum dots 50 as a functional material that contributes to the function of the light-emitting layer 24*c*, and the light-emitting layers 24*cr*, 24*cg* and 24*cb* of the respective colors are configured such that at least the particle diameters of the quantum dots 50 are different from each other in accordance with their light emission spectrum.

The first electrode (anode) 22 is composed of, for instance, indium tin oxide (ITO), indium zinc oxide (IZO), silver (Ag), or Al or is composed of, for instance, a laminate of Ag-containing alloy and Al-containing alloy, and the first electrode 2 has light reflectivity. The second electrode (cathode) 25 is a transparent electrode composed of a light-transparency conductor, including a thin film of Ag, Au, Pt, Ni, Ir or Al, a thin film of MgAg alloy, an ITO, and an indium zinc oxide (IZO). It is noted that a configuration other than the foregoing may be provided where the second electrode 25 is formed using nanowires of metal, such as silver. For forming the second electrode 25, which is a flat common electrode in an upper layer, by the use of such metal nanowires, applying a solution containing the metal nanowires can provide the second electrode 25. As a result, layers except the first electrode 22, that is, the individual layers of the function layer 24 and the second electrode 25 can be formed in the light-emitting element layer 5 of the display device 2 through a drop method using a predetermined solution, thereby easily forming the display device 2 that is manufactured simply.

The sealing layer 6 is transparent to light and includes an inorganic sealing film 26 directly formed on the second electrode 25 (in contact with the second electrode 25), an organic film 27 over the inorganic sealing film 26, and an inorganic sealing film 28 over the organic film 27. The sealing layer 6, covering the light-emitting element layer 5, prevents foreign substances, such as water and oxygen, from intruding into the light-emitting element layer 5. It is noted that the placement of the sealing layer 6 can be omitted when the light-emitting layer 24*c* is composed of a quantum-dot light-emitting layer.

The organic film 27 has a flattening effect and light transparency and can be formed through, for instance, ink-jet application using an organic material that can be applied. The inorganic sealing films 26 and 28 are inorganic insulating films and can be composed of, for instance, a silicon oxide film, a silicon nitride film, or a silicon oxide nitride film, all of which are formed through CVD, or the films can be composed of, for instance, a laminate of these films.

A function film 39 has at least one of the function of optical compensation, the function of touch sensing, the function of protection, and other functions.

Figure 5:
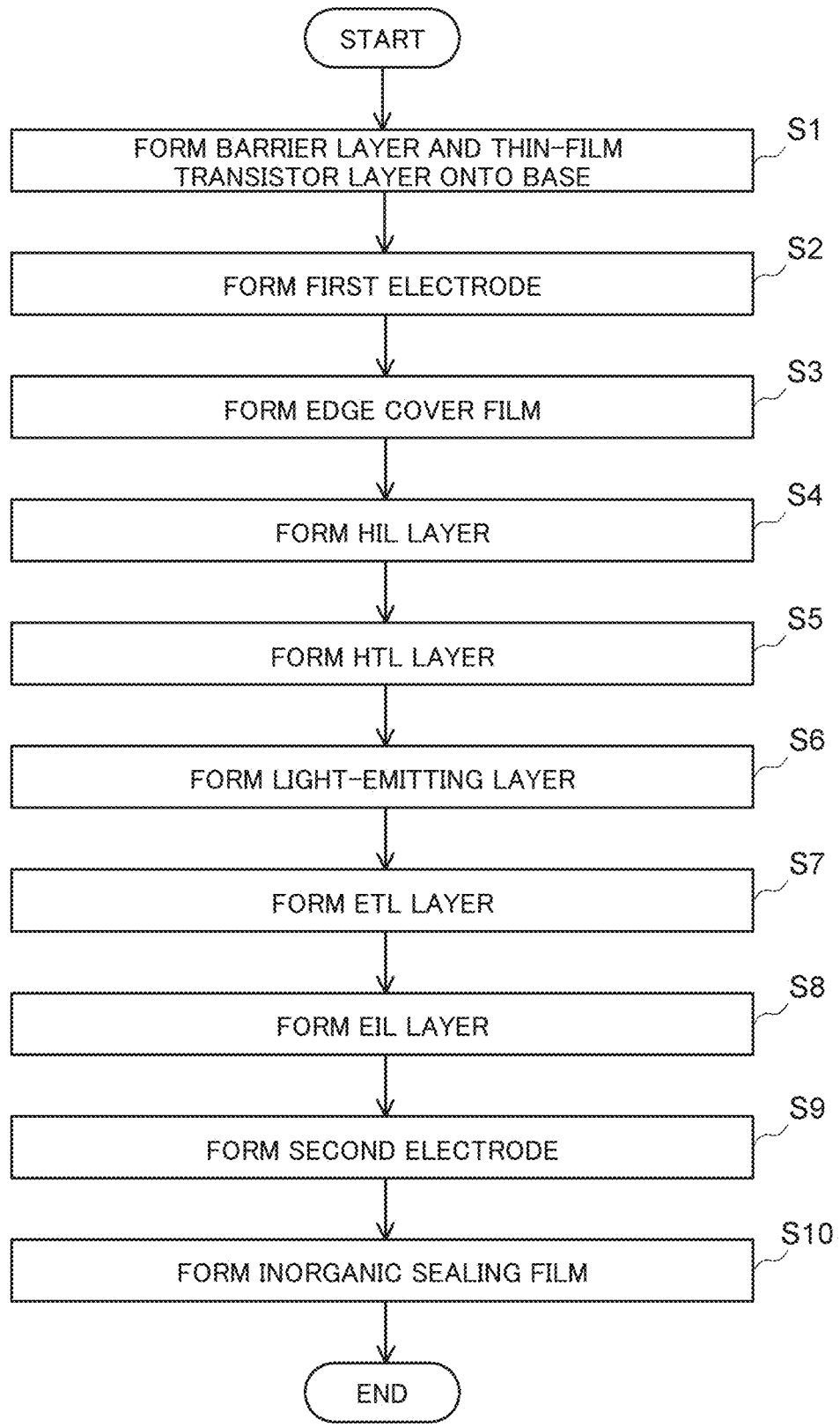
FIG. 5 is a flowchart showing a method for manufacturing the display device.

The following specifically describes a method for manufacturing the display device 2 according to this embodiment with also reference to FIG. 5. FIG. 5 is a flowchart showing the method for manufacturing the display device.

As illustrated in FIG. 5, the method for manufacturing the display device 2 according to this embodiment includes, firstly (Step S1), forming the barrier layer 3 and the thin-film transistor layer 4 onto the base 12. The next (Step S2) is forming the first electrode (anode) 22 onto the flattening film 21 through, for instance, sputtering and photolithography. The next (Step S3) is forming the edge cover film 23.

The next (Step S4) is forming the hole injection layer (HIL) 24*a* through a drop method, such as an ink-jet method. To be specific, examples of a solvent contained in a hole-injection-layer forming solution in this step of forming a hole injection layer include ethanol, 2-propanol, ethylene glycol, polyethylene glycol, butyl benzoate, toluene, chlorobenzene, tetrahydrofuran, and 1,4-dioxane. Further, polythiophene conductors, such as PEDOT:PSS, or inorganic compounds, such as a nickel oxide and a tungsten oxide, for instance, are used as a solute contained in the hole-injection-layer forming solution, that is, as a hole injection material (functional material). Moreover, this HIL layer forming step includes baking the hole-injection-layer forming solution dropped onto the first electrode 22 at a predetermined temperature to thus form the hole injection layer 24*a* having a thickness of 20 to 50 nm.

The next (Step S5) is forming the first hole transport layer (HTL) 24*b* through a drop method, such as an ink-jet method, and forming (Step S6) the light-emitting layer 24*c* at substantially the same time as the first hole transport layer 24*b*.

Figure 6:
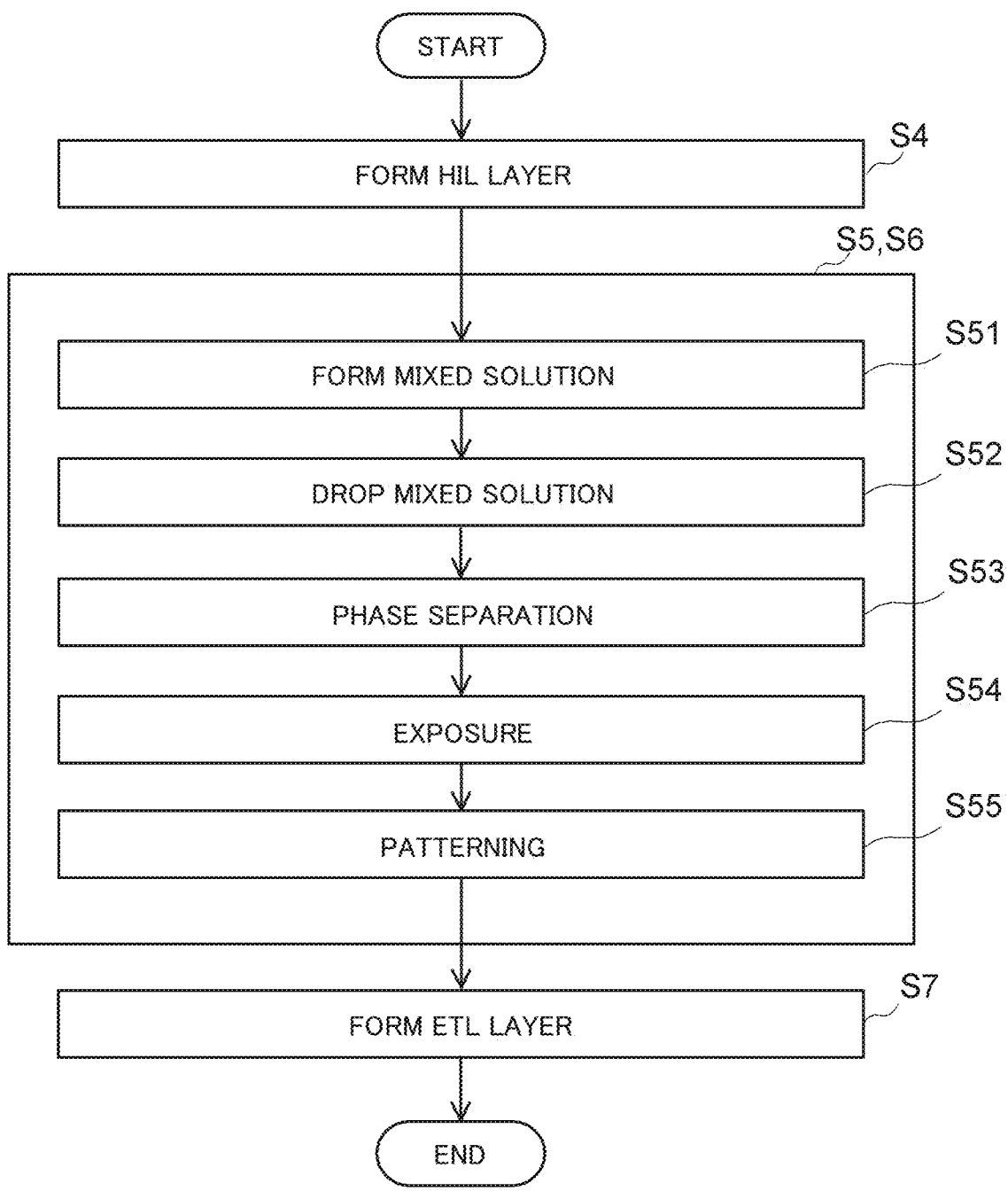
FIG. 6 is a flowchart showing a specific method for manufacturing the main components of the display device.

Here, the step of forming a first hole transport layer and the step of forming a light-emitting layer will be detailed with also reference to FIG. 6. FIG. 6 is a flowchart showing a specific method for manufacturing the main components of the display device.

Step S5, i.e., the step of forming a first hole transport layer and Step S6, i.e., the step of forming a light-emitting layer include, as shown in Step SM in FIG. 6, a preliminary process step, which is herein a mixed solution forming step of forming a mixed solution for forming the first hole transport layer 24*b* and light-emitting layer 24*c*. To be specific, the mixed solution forming step uses, for instance, toluene or propyleneglycol monomethyl ether acetate (PG-MEA) as a solvent of the mixed solution.

Further, monomers of a predetermined hole transport material and a photopolymerization initiator that initiates, by light, the polymerization of the monomers of the hole transport material, for instance, are used as a hole transport material (functional material) of a solute contained in the mixed solution. Further, the monomers of the predetermined hole transport material are selected from the group consisting of, for instance, N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC). The photopolymerization initiator is a cationic photopolymerization initiator for instance and is selected from the group consisting of, for instance, 4-octyloxy-phenyl-phenyliodoniumhexafluoroantimonate (OPPI), diaryliodonium special phosphorus-based anion salt (e.g., IK-1), and triarylsulfonium special phosphorus-based anion salt (e.g., CPI-410S).

Further, the quantum dots 50 containing, for instance, C, Si, Ge, Sn, P, Se, Te, Cd, Zn, Mg, S, In, or O are used as the light-emitting material (functional material) of the solute contained in the mixed solution. Further, the ligands 53 are composed of, for instance, an alkyl chain with 13 or more and 18 or less carbon atoms contained in each ligand 53, and a predetermined functional group or are composed of, for instance, a univalent unsaturated fatty acid (such as an oleic acid) with 13 or more and 18 or less carbon atoms contained in each ligand 53, in order to prevent the hole transport material from such exposure to the light-emitting layer 24c as earlier described. Further, the functional group is selected from the group consisting of, for instance, a carboxylic acid, a thiol, and an amine. However, when an amine is used as the functional group, it is difficult to perform RGB color-coding (i.e., to form the light-emitting elements Xr, Xg and Xb) due to a patterning step, which will be described later on; hence, a carboxylic acid or a thiol is preferably used as the functional group to form the light-emitting elements Xr, Xg and Xb.

The next is a mixed solution dropping step, as shown in Step S52 in FIG. 6. In the mixed solution dropping step, the foregoing mixed solution is dropped over the first electrode 22, to be specific, onto the hole injection layer 24a.

The next is a phase separation step, as shown in Step S53 in FIG. 6. In the phase separation step, the first hole transport layer 24b, containing the foregoing hole transport material and the quantum dots 50 coordinating with the ligands 53, and the light-emitting layer 24c, provided on the first hole transport layer 24b and containing only the quantum dots 50 coordinating with the ligands 53, undergo phase separation from the dropped mixed solution. Further, the phase separation step includes, for instance, allowing the mixed solution dropped onto the hole injection layer 24a to stand for a predetermined time to thus separate and form the first hole transport layer 24b and the light-emitting layer 24c from the mixed solution. Further, the phase separation step includes phase separation into the first hole transport layer 24b and the light-emitting layer 24c with the ligands 53 preventing the hole transport material from being exposed to the light-emitting layer 24c. Further, the solvent within the mixed solution at this time is vaporized to become almost lost. It is noted that other than this description, the solvent may be dried along with phase separation through, for instance, pre-baking.

The next is an exposure step, as shown in Step S54 in FIG. 6. The exposure step includes exposing the first hole transport layer 24b and the light-emitting layer 24c through irradiation with predetermined light (e.g., ultraviolet light). In the exposure step, the monomers of the foregoing hole transport material undergoes polymerization to turn into a polymer, and the irradiated portion of the first hole transport layer 24b solidifies. This forms the first hole transport layer 24b having a thickness of, for instance, 20 to 50 nm. Furthermore, as a result of the exposure step, the light-emitting layer 24c solidifies as well in a portion (i.e., a portion irradiated with light) located on the solidified first hole transport layer 24b. This forms the light-emitting layer 24c having a thickness of, for instance, about several nanometers. It is noted that in the monomers of the hole transport material, all the monomers do not undergo polymerization (turn into polymers) as a result of a polymerization reaction, but the monomers of the hole transport material can be extracted even after the display device 2 is completed; thus, this use can be confirmed.

The next is a patterning step, as shown in Step S55 in FIG. 6. The patterning step includes patterning the hole transport layer 24b and the light-emitting layer 24c individually into a predetermined shape by subjecting the first hole transport layer 24b and the light-emitting layer 24c to development using a predetermined developing solution (e.g., toluene). That is, the unsolidified portion of the first hole transport layer 24b and the unsolidified portion of the light-emitting layer 24c are removed in the patterning step.

Then, the mixed solution forming step, the mixed solution dropping step, the phase separation step, the exposure step, and the patterning step, shown in Step S51 through Step S55, are sequentially performed repeatedly for each of the colors of emitted light. This forms, as illustrated in FIG. 4, the light-emitting layer 24cr of the red light-emitting element Xr, the light-emitting layer 24cg of the green light-emitting element Xg, and the light-emitting layer 24cb of the blue light-emitting element Xb. Consequently, in this embodiment, a pixel pattern corresponding to three colors: R, G, and B is formed in combination with a drop method and photolithography, thus completing RGB color-coding.

Referring back to FIG. 5, the next (Step S7) is forming the electron transport layer (ETL) 24d through a drop method, such as an ink-jet method or spin coating. To be specific, this step of forming an electron transport layer uses, for instance, 2-propanol, ethanol, ethylene glycol, polyethylene glycol, toluene, chlorobenzene, tetrahydrofuran, or 1,4-dioxane as a solvent of an electron-transport-layer forming solution. Further, nanoparticles of, for instance, zinc oxide (ZnO) or magnesium-added zinc oxide (MgZnO) is used as a solute, that is, an electron transport material (functional material).

The next (Step S8) is forming the electron injection layer (EIL) 24e through a drop method, such as an ink-jet method or spin coating. To be specific, this step of forming an electron injection layer uses, for instance, 2-propanol, ethanol, ethylene glycol, polyethylene glycol, toluene, chlorobenzene, tetrahydrofuran, or 1,4-dioxane as a solvent of an electron-injection-layer forming solution. Further, nanoparticles of, for instance, zinc oxide (ZnO) or magnesium-added zinc oxide (MgZnO) is used as a solute, that is, an electron injection material (functional material). Further, an organic salt selected from the group consisting of, for instance, quaternary ammonium salt, lithium tetrafluoroborate salt, and lithium hexafluorophosphate salt is used as an additive, like the foregoing solution for forming a hole injection layer. It is noted that other than this description, LiF or other things may be formed as the electron injection layer 24e through, for instance, evaporation.

The next (Step S9) is forming, as the second electrode (cathode) 25, a thin film of metal, such as aluminum or silver, onto the electron injection layer 24e through, for instance, evaporation or sputtering.

The next (Step S10) is forming the inorganic sealing film 26 so as to cover the second electrode 25, followed by applying a material (precursor) of the organic film 27 onto the inorganic sealing film 26 through ink-jet application, followed by curing to form the organic film 27, followed by forming the inorganic sealing film 28 over the organic film 27. This manufactures the display device 2 having the light-emitting elements Xr, Xg, and Xb of RGB, as illustrated in FIG. 2.

The display device 2 can be manufactured in the foregoing manner.

In the display device 2 according to this embodiment configured in the foregoing manner, the quantum dots 50 and the ligands 53 coordinating with the quantum dots 50 are contained in the light-emitting layer 24c. Further, the first hole transport layer 24b contains the hole transport material and the quantum dots 50 coordinating with the ligands 53. Furthermore, the ligands 53 coordinate with the quantum dots 50 at the interface between the light-emitting layer 24c and the first hole transport layer 24b so as to prevent the hole transport material from being exposed to the light-emitting layer 24c. This enables the display device 2 according to this embodiment to prevent electrical contact with (leakage to) material on the electron transport layer side of the hole transport material, that is, the electron transport material of the electron transport layer 24d and/or the cathode material within the electron transport layer 24d, serving also as the second electrode (cathode) 25, even when the light-emitting layer is formed through a drop method. As a result, the display device 2 that can prevent degradation in display performance can be configured in this embodiment.

Figure 7:
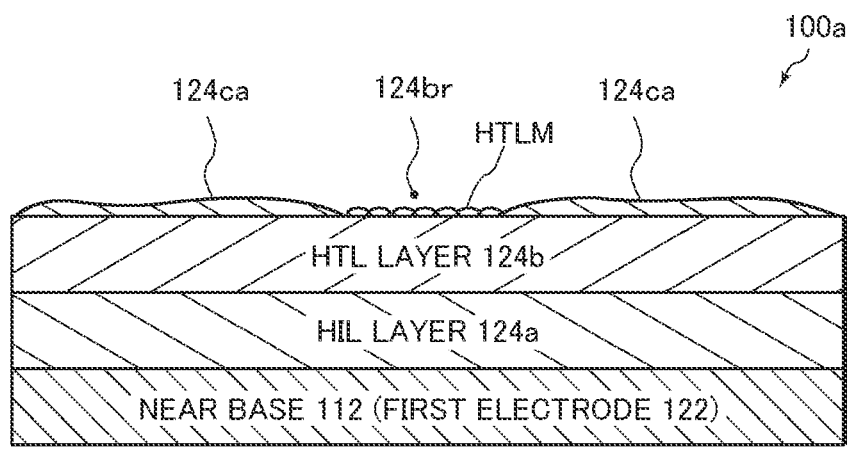
FIG. 7 illustrates a problem in a comparative example.
Figure 7:
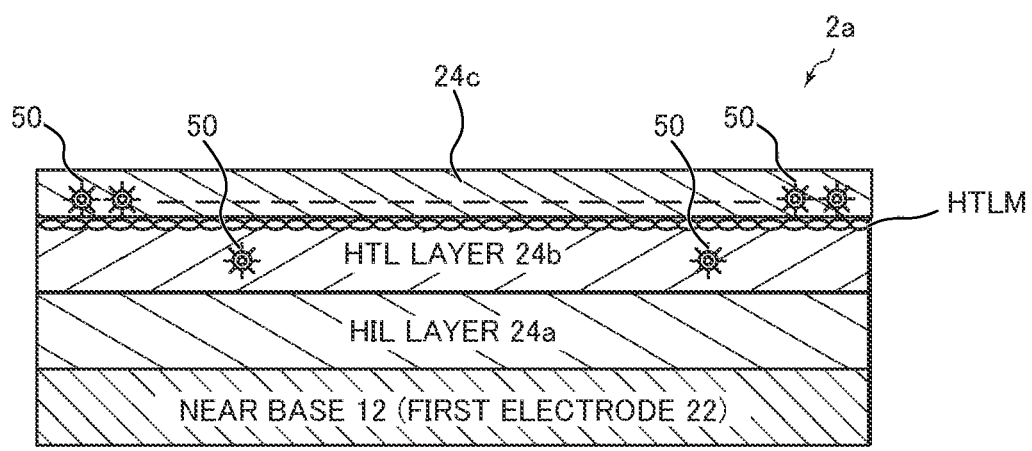

Here, the following specifically describes an effect of the display device 2 according to this embodiment with reference to FIG. 7. FIG. 7 illustrates a problem in a comparative example; FIG. 7(a) and FIG. 7(b) respectively illustrate how a light-emitting layer and a hole transport layer are formed in the comparative example and how a light-emitting layer and a hole transport layer are formed in the device according to this embodiment.

Firstly, a comparative example 100a illustrated in FIG. 7(a) will be described. In the comparative example 100a, a solution was prepared in which a solute consisting of monomers HTLM of the foregoing hole transport material, a photopolymerization initiator, and quantum dots each coordinating with ligands was dissolved in toluene (solvent). Here, unlike the device according to this embodiment, a ligand containing 12 or less carbon atoms, dodecanethiol for instance, was used in the comparative example 100a. Moreover, in the comparative example 100a, a hole injection layer 124a was formed on a base 112 (first electrode 122). Subsequently, the forgoing solution was dropped onto the hole injection layer 124a to subject the forgoing solution to phase separation. Next, a sectional image of the comparative example 100a was taken through SEM to thus find that the solution was separated into the hole transport layer 124b and a light-emitting layer 124ca, as illustrated in FIG. 7(a), but the hole transport layer 124b adjacent to the light-emitting layer 124ca had an exposed portion 124br of the monomers HTLM of the hole transport material appearing at the interface between the hole transport layer 124b and the light-emitting layer 124ca. This has revealed that forming, for instance, an electron transport layer in the comparative example 100a possibly establishes electrical contact with the electron transport material within the electron transport layer.

In contrast to this, an image of the device according to this embodiment 2a illustrated in FIG. 7(b) was taken through SEM to thus demonstrate that even after the phase separation into the first hole transport layer 24b and the light-emitting layer 24c, phase separation was made into the first hole transport layer 24b and the light-emitting layer 24c with the ligands 53 of the quantum dot 50, illustrated in FIG. 3(b), preventing the monomers HTLM of the hole transport material from being exposed to the light-emitting layer 24c, as illustrated in FIG. 7(b).

Further, Table 1 shows example results of the experiment conducted by the inventors of the disclosure.

TABLE 1

| Functional group: carboxylic acid, thiol or amine | | | | | | | |
|---|---|---|---|---|---|---|---|
| Number of carbon atoms | 12 | 13 | 14 | ... | 17 | 18 | 19 |
| Prevention of exposed portion | X | ○ | ○ | ○ | ○ | ○ | ○ |
| Light emission performance | X | ○ | ○ | ○ | ○ | ○ | X |

Table 1 has clearly revealed that when an alkyl chain and an carboxylic acid, a thiol or an amine as a predetermined functional group are used in a ligand 53 containing 12 or less carbon atoms, the monomers HTLM of a hole transport material, such as OTPD, has an exposed portion, thus degrading light emission performance. Table 1 has also demonstrated that a ligand 53 containing 19 or more carbon atoms degrades the hole transportability of the first hole transport layer 24b, thus degrading light emission performance. That is, it has been revealed that too many carbon atoms in the long-chain portion 53a of the ligand 53 hinder hole transport.

In contrast to this, it has been revealed that the ligand 53 containing 13 or more and 18 or less carbon atoms prevents such an exposed portion as earlier described and also prevents degradation in hole transportability, thus offering the display device 2 with high light emission performance, and by extension, high display performance. Further, using a univalent unsaturated fatty acid, such as oleic acid, as the predetermined functional group obtained the same experiment result as the forgoing thiol and other materials.

As described above, in the display device 2 according to this embodiment that includes the first hole transport layer 24b and the light-emitting layer 24c on the first hole transport layer 24b, both formed using a mixed solution containing the quantum dots 50 each coordinating with the ligands 53, containing the monomers HTLM of a hole transport material, such as OTPD, and containing a photopolymerization initiator, it has been revealed that forming the ligands 53 shown in Table 1 and other things can prevent degradation in display performance.

First Modification

Figure 8:
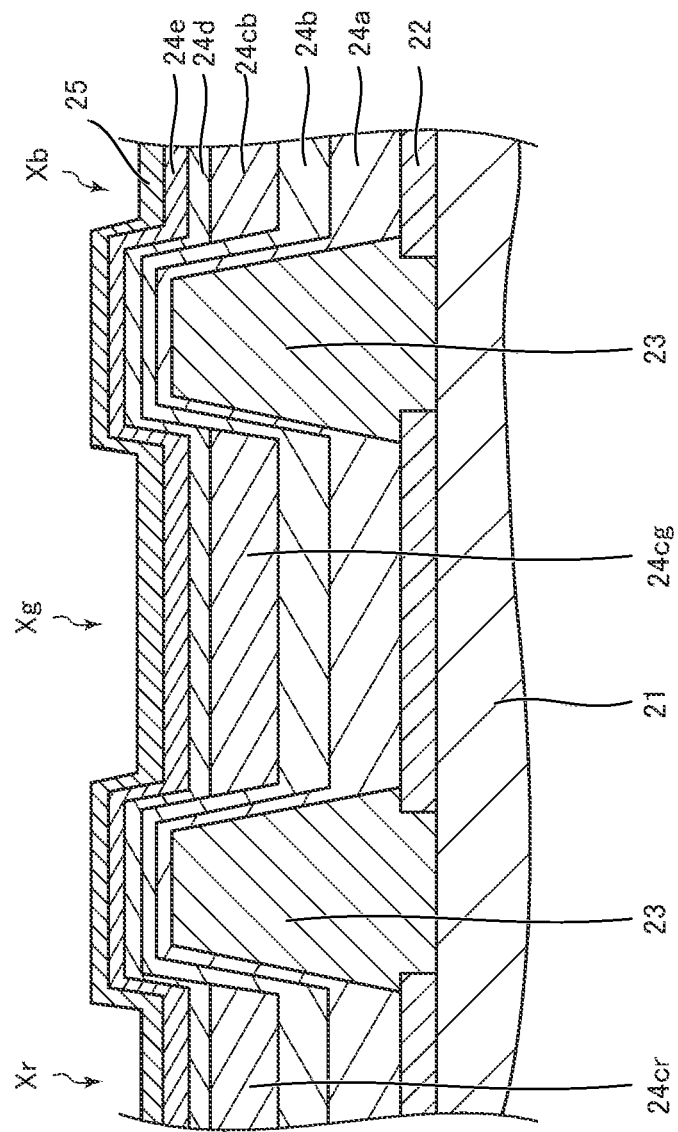
FIG. 8 is a sectional view of a first modification of the foregoing display device.

FIG. 8 is a sectional view of a first modification of the foregoing display device.

In the drawing, a main difference between the first modification and the first embodiment lies in that the hole injection layer 24a and the first hole transport layer 24b are provided as common layers common to all the subpixels. It is noted that components common to those in the first embodiment will be denoted by the same signs, and that the description of redundancies between them will be omitted.

In the display device 2 according to the first modification, the hole injection layer 24a and the first hole transport layer 24b are formed in a flat manner to be common to the light-emitting elements Xr, Xg and Xb, as illustrated in FIG. 8. That is, the hole injection layer 24a and the first hole transport layer 24b each can be formed not only through such an ink-jet method as described in the first embodiment, but through other drop methods, including spin coating.

The first modification with the foregoing configuration can achieve an action and effect similar to that in the first embodiment. Further, the hole injection layer 24a and the first hole transport layer 24b are formed as common layers, thus also enabling simplified process steps for manufacturing the display device 2.

Second Modification

Figure 9:
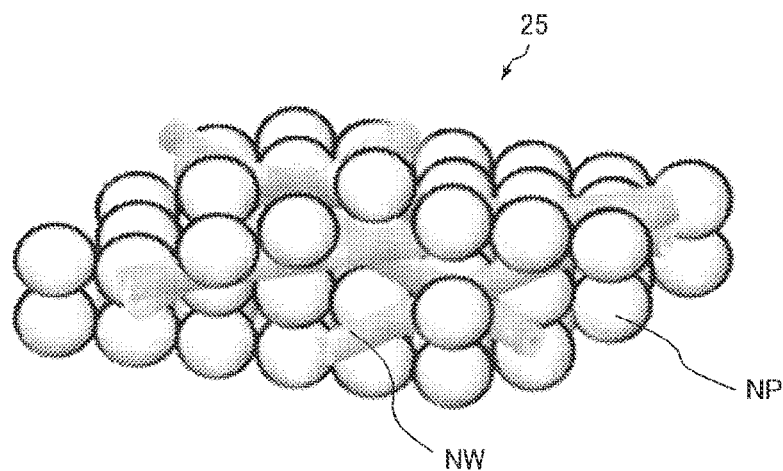
FIG. 9 illustrates main components in a second modification of the display device.
Figure 9:
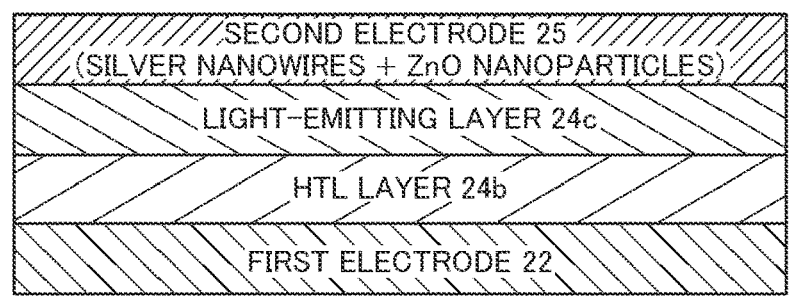
Figure 9:
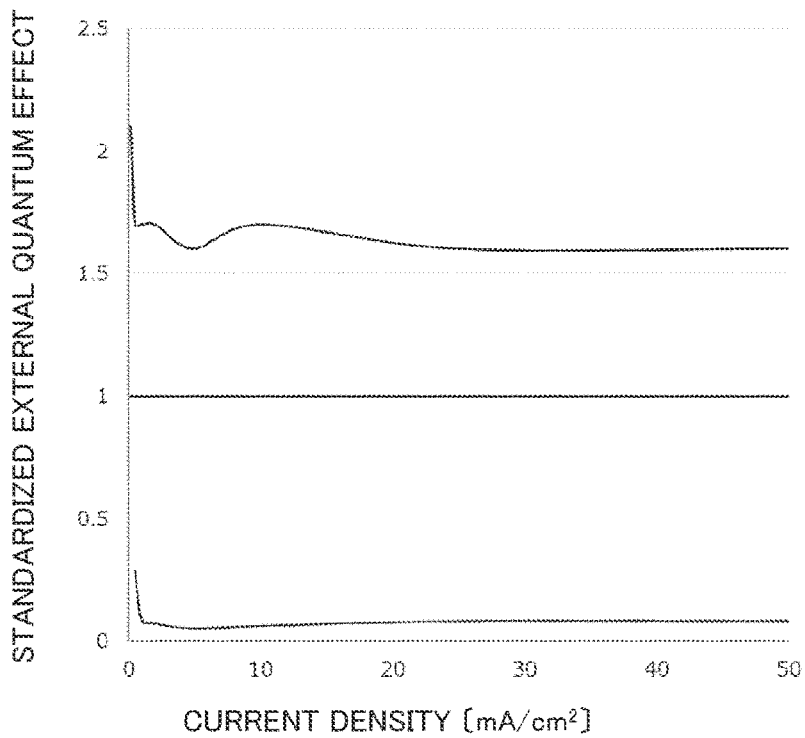

FIG. 9 illustrates main components in a second modification of the display device; FIG. 9(a) is a perspective view of a specific configuration of a second electrode in the second modification, FIG. 9(b) illustrates a specific configuration of a light-emitting element layer in the second modification, and FIG. 9(c) is a graph showing an effect in the second modification.

In the drawings, a main difference between the second modification and the first embodiment lies in that the second electrode 25 including an electron injection layer and an electron transport layer is provided. It is noted that components common to those in the first embodiment will be denoted by the same signs, and that the description of redundancies between them will be omitted.

In the display device 2 according to the second modification, the second electrode 25 contains metal nanowires, e.g., silver nanowires NW, and zinc oxide (ZnO) nanoparticles NP, which are an electron-injection-layer material and electron transport material, as illustrated in FIG. 9(a). That is, the second electrode 25 containing the silver nanowires NW and the zinc oxide nanoparticles NP is obtained by applying and drying a mixed solution with a silver nanowire solution and a zinc-oxide nanoparticle solution mixed at a desired ratio and stirred. To be specific, a configuration is established where the silver nanowires NW are arranged three-dimensionally on a random basis to allow the silver nanowires NW to pass through the gaps between the zinc oxide nanoparticles NP (an average particle diameter of 1 to 30 nm).

Further, in the display device 2 according to the second modification, a configuration is established where the first electrode 22 (anode), the HTL layer (first hole transport layer) 24b, the light-emitting layer 24c (e.g., a quantum-dot light-emitting layer), and the second electrode (common cathode) 25 including an electron injection layer and an electron transport layer are provided in this order, as illustrated in FIG. 9(b).

Figure 3:
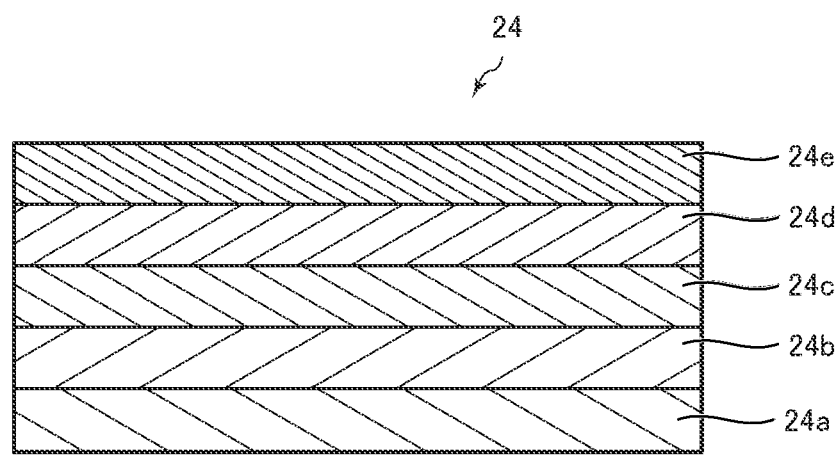
FIG. 3(a) illustrates a specific configuration of a function layer illustrated in FIG. 2.
FIG. 3(b) illustrates a quantum dot contained in a light-emitting layer illustrated in FIG. 3(a).
Figure 3:
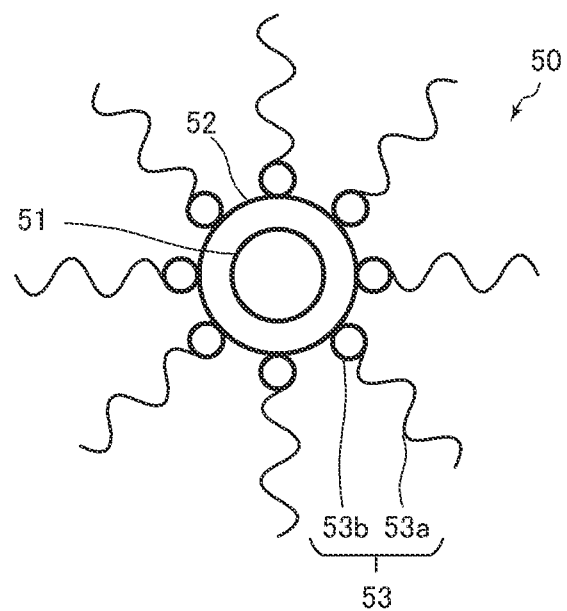
Figure 4:
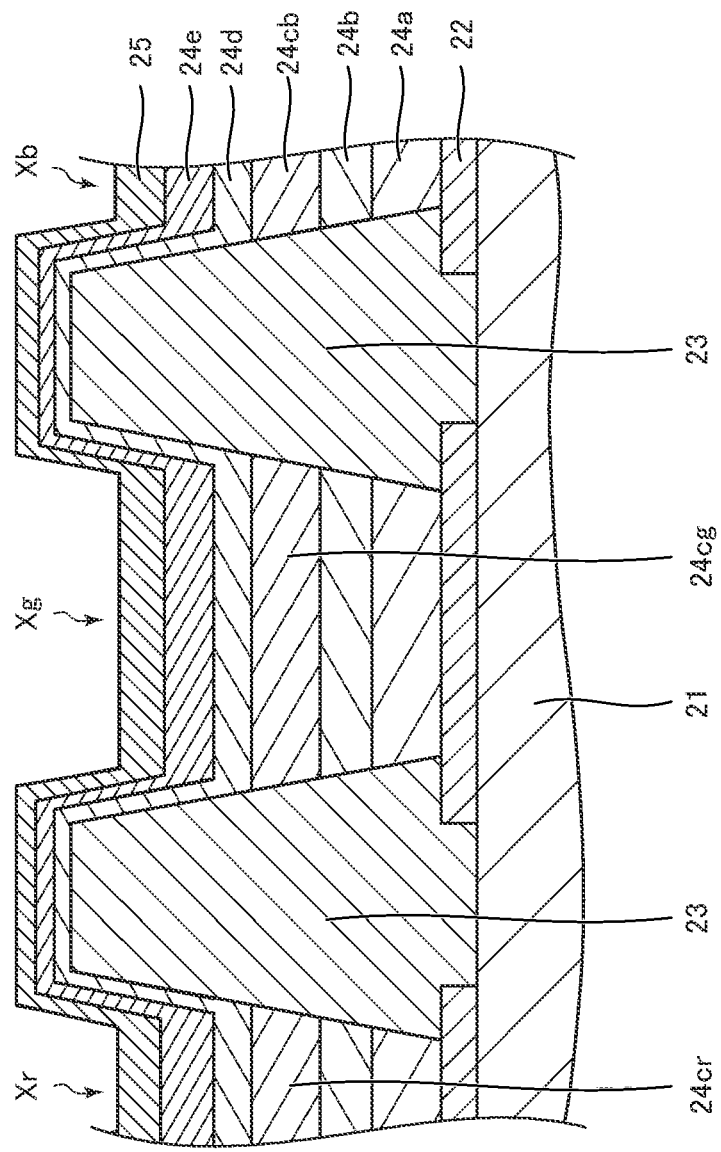
FIG. 4 is a sectional view of a specific example configuration of a light-emitting element illustrated in FIG. 2.

Further, in the configuration illustrated in FIG. 9(a), the area of contact between the silver nanowires NW within the second electrode 25 and the zinc oxide nanoparticles NP within the second electrode 25, which are electron transport materials, increases; accordingly, FIG. 9(c) demonstrates that within a current density of 0 to 50 [milliampere/square centimeter], an external quantum efficiency UB (standardized value with respect to a reference value) of the light-emitting element X in the second modification improves to a much greater degree than the configuration illustrated in FIG. 3, i.e., an external quantum efficiency UA (a reference value at each current density=1) of the light-emitting element X including the second electrode 25 formed on the electron injection layer (zinc-oxide nanoparticle layer) 24e, and to a much greater degree than standardized external quantum efficiency Ua (standardized value with respect to a reference value) of a light-emitting element having a cathode of a typical silver thin film.

Further, the number of process steps can be reduced when compared to an instance where the electron transport layer 24d, the electron injection layer 24e, and the second electrode (common cathode) 25 are formed in different process steps.

Further, too many metal nanowires NW reduce the ability of electron transport to the light-emitting layer 24c, whereas too few metal nanowires NW increase the value of electrical resistance. Accordingly, the volume ratio of the metal nanowires NW to the ZnO nanoparticles NP is 1/49 to 1/9.

The second modification with the foregoing configuration can achieve an action and effect similar to that in the first embodiment.

Second Embodiment

Figure 10:
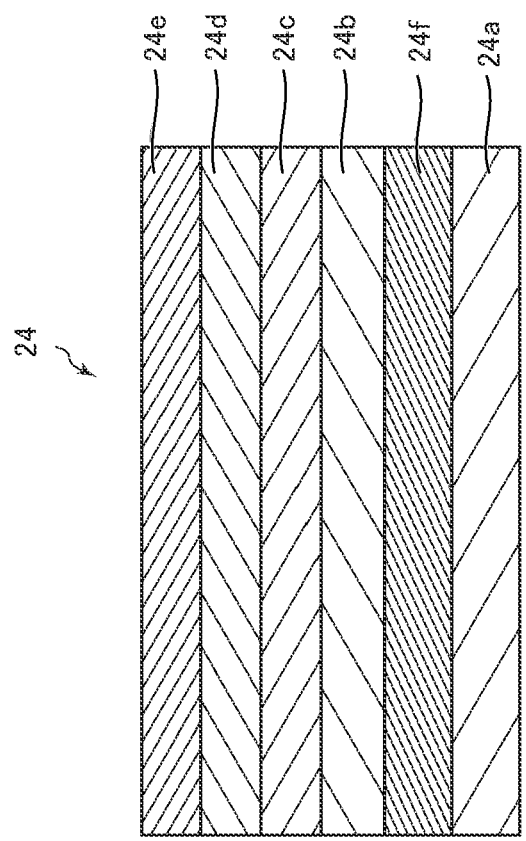
FIG. 10 illustrates a specific configuration of a function layer of a display device according to a second embodiment of the disclosure.

FIG. 10 illustrates a specific configuration of a function layer of a display device according to a second embodiment of the disclosure. In the drawing, a main difference between this embodiment and the first embodiment lies in that a second hole transport layer is provided between a first electrode and a first hole transport layer. It is noted that components common to those in the first embodiment will be denoted by the same signs, and that the description of redundancies between them will be omitted.

A display device 2 according to this embodiment has a function layer 24 that includes the following on a first electrode 22, as illustrated in FIG. 10: a hole injection layer 24a, a second hole transport layer 24f, a first hole transport layer 24b, a light-emitting layer 24c, an electron transport layer 24d, and an electron injection layer 24e. That is, in the function layer 24, the second hole transport layer 24f is provided between the first electrode 22 and the first hole transport layer 24b.

The second hole transport layer 24f contains a hole transport material selected from the group consisting of Poly[(9,9-dioctylfluorenyl-2,7-diyl)-co-(4,4'-(N-(4-sec-butylphenyl)diphenylamine)] (TFB) and Poly[N,N'-bis(4-butylphenyl)-N,N'-bis(phenyl)-benzidine] (poly-TPD). Further, the second hole transport layer 24f is formed, for instance, in a flatter manner to be common to light-emitting elements Xr, Xg and Xb.

Further, a step of forming the second hole transport layer 24f is performed before a step of forming the first hole transport layer and a step of forming the light-emitting layer, which are respectively shown as Steps S5 and S6 in FIG. 6. To be specific, the step of forming the second hole transport layer uses, for instance, toluene or chlorobenzene as a solvent. Further, TFB or poly-TPD is used as a solute, that is, a hole transport material (functional material). Moreover, the step of forming the second hole transport layer includes baking a solution dropped onto the hole injection layer 24a at a predetermined temperature to thus form the second hole transport layer 24f having a thickness of, for instance, 20 to 50 nm.

This embodiment with the foregoing configuration can achieve an action and effect similar to that in the first embodiment. Further, this embodiment, which includes the second hole transport layer 24f provided between the hole injection layer 24a and the first hole transport layer 24b and containing TFB or poly-TPD, enables the highest occupied molecular orbital (HOMO) to be formed into a stair-like shape, thus improving the efficiency of hole transport from the hole injection layer 24a to the first hole transport layer 24b.

Third Embodiment

Figure 11:
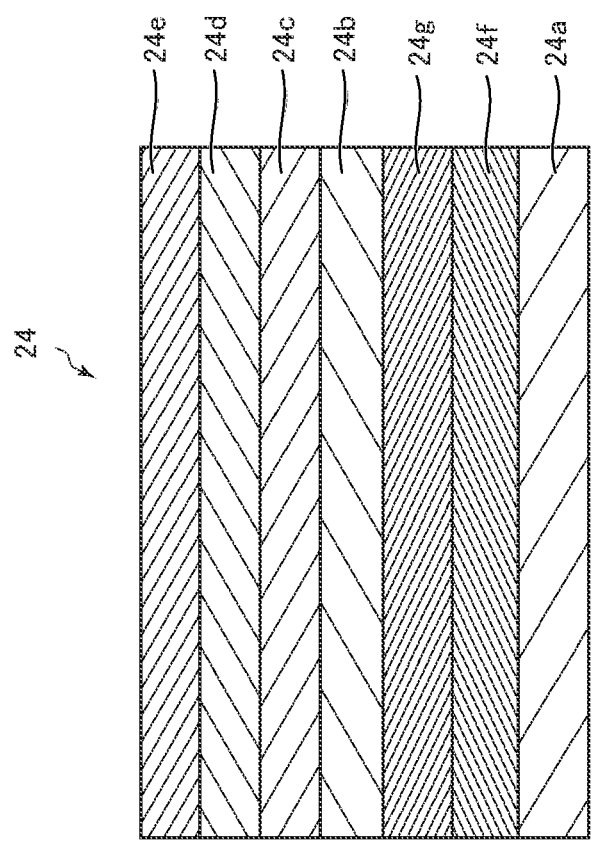
FIG. 11 illustrates a specific configuration of a function layer of a display device according to a third embodiment of the disclosure.

FIG. 11 illustrates a specific configuration of a function layer of a display device according to a third embodiment of the disclosure. In the drawing, a main difference between this embodiment and the second embodiment lies in that a third hole transport layer is provided between a first hole transport layer and a second hole transport layer. It is noted that components common to those in the second embodiment will be denoted by the same signs, and that the description of redundancies between them will be omitted.

A display device 2 according to this embodiment has a function layer 24 that includes the following on a first electrode 22, as illustrated in FIG. 11: a hole injection layer 24a, a second hole transport layer 24f, a third hole transport layer 24g, a first hole transport layer 24b, a light-emitting layer 24c, an electron transport layer 24d, and an electron injection layer 24e. That is, in the function layer 24, the third hole transport layer 24g is provided between the first hole transport layer 24b and the second hole transport layer 24f.

The third hole transport layer 24g contains the hole transport material contained in the first hole transport layer 24b. That is, the third hole transport layer 24g contains monomers of a hole transport material selected from the group consisting of OTPD, QUPD and X-F6-TAPC and contains a (cationic) photopolymerization initiator selected from the group consisting of OPPI, diaryliodonium special phosphorus-based anion salt, and triarylsulfonium special phosphorus-based anion salt. Further, the third hole transport layer 24g is formed, for instance, in a flatter manner to be common to light-emitting elements Xr, Xg and Xb.

Further, a step of forming the third hole transport layer 24g is performed between a step of forming the second hole transport layer, which is described above, and a step of forming the first hole transport layer as well as a step of forming the light-emitting layer, which are respectively shown as Steps S5 and S6 in FIG. 6. To be specific, the step of forming the third hole transport layer uses, for instance, toluene, chlorobenzene, or propyleneglycol monomethyl ether acetate (PGMEA) as a solvent and uses the foregoing monomers of the hole transport material and the foregoing photopolymerization initiator as a solute. Moreover, a solution containing these solvent and solute are dropped onto the second hole transport layer, and then, like that according to the first embodiment, the dropped solution undergoes exposure and then solidification through irradiation with predetermined light, to thus form the third hole transport layer 24g having a thickness of, for instance, 20 to 50 nm.

This embodiment with the foregoing configuration can achieve an action and effect similar to that in the second embodiment. Further, this embodiment, which includes the third hole transport layer 24g provided between the first hole transport layer 24b and the second hole transport layer 24f and containing the hole transport material contained in the first hole transport layer 24b, can improve the efficiency of hole transport between the first hole transport layer 24b and the second hole transport layer 24f and can improve the adhesion between their interfaces.

INDUSTRIAL APPLICABILITY

The disclosure is useful for a display device and a method for manufacturing the display device that can prevent degradation in display performance even when a light-emitting layer is formed using a drop method.

The invention claimed is:

1. A display device provided with a display region having a plurality of pixels, and a frame region surrounding the display region, each of the plurality of pixels comprising:
   a thin-film transistor layer; and
   a light-emitting element layer including a plurality of light-emitting elements each including a first electrode, a function layer, and a second electrode, the plurality of light-emitting elements being configured to emit mutually different colors of light,
   wherein the function layer includes a first hole transport layer, a light-emitting layer provided on the first hole transport layer, and an electron transport layer provided on the light-emitting layer,
   the first hole transport layer contains a hole transport material,
   the light-emitting layer includes a first portion containing only a quantum dot comprising a light-emitting material, the quantum dot coordinating with a ligand, and a second portion being within the first hole transport layer and containing the quantum dot coordinating with the ligand and the hole transport material,
   the ligand coordinates with the quantum dot so as to prevent the hole transport material from being exposed to the quantum dot,
   the hole transport material contains OTPD and a photopolymerization initiator, and
   the ligand comprising an alkyl chain and a functional group selected from the group consisting of a carboxylic acid, a thiol, the ligand an amine or a univalent unsaturated fatty acid, and containing 13 or more and 18 or less carbon atoms.

2. The display device according to claim 1, wherein the first hole transport layer and the light-emitting layer are formed using a mixed solution of the hole transport material, the quantum dot, and the ligand.

3. The display device according to claim 1, wherein the photopolymerization initiator is a cationic photopolymerization initiator.

4. The display device according to claim 3, wherein the cationic photopolymerization initiator is selected from the group consisting of OPPI, diaryliodonium special phosphorus-based anion salt, and triarylsulfonium special phosphorus-based anion salt.

5. The display device according to claim 1, wherein the ligand is an oleic acid.

6. The display device according to claim 1, wherein the functional group is the carboxylic group acid or the thiol group.

7. The display device according to claim 1, wherein a second hole transport layer is provided between the first electrode and the first hole transport layer.

8. The display device according to claim 7, wherein the second hole transport layer contains a hole transport material selected from the group consisting of TFB and poly-TPD.

9. The display device according to claim 7, wherein a third hole transport layer is provided between the first hole transport layer and the second hole transport layer.

10. The display device according to claim 9, wherein the third hole transport layer contains the hole transport material contained in the first hole transport layer.

11. A method for manufacturing a display device provided with a display region having a plurality of pixels, and a frame region surrounding the display region, each of the plurality of pixels being provided with a thin-film transistor layer, and a light-emitting element layer including a plurality of light-emitting elements each including a first electrode, a function layer, and a second electrode, the plurality of light-emitting elements being configured to emit mutually different colors of light, the method comprising:

for each function layer,
a mixed solution forming step of forming a mixed solution that contains a hole transport material and a quantum dot coordinating with a ligand;
a mixed solution dropping step of dropping the mixed solution over the first electrode;
a phase separation step of subjecting a first hole transport layer and a light-emitting layer to phase separation from the mixed solution dropped, the first hole transport layer containing the hole transport material, the light-emitting layer being provided on the first hole transport layer and including a first portion containing only the quantum dot coordinating with the ligand and a second portion being within the first hole transport layer and containing the quantum dot coordinating with the ligand and the hole transport material;
an exposure step of exposing portions of the first hole transport layer and the light-emitting layer through irradiation to solidify the portions of the first hole transport layer and the light-emitting layer; and
a patterning step of patterning the first hole transport layer and the light-emitting layer individually into a pattern by subjecting the unexposed portions of the first hole transport layer and the light-emitting layer to development using a developing solution; wherein the hole transport material contains OTPD and a photopolymerization initiator, and the ligand comprising of an alkyl chain and a functional group selected from the group consisting of a carboxylic acid, a thiol, and an amine or a univalent unsaturated fatty acid, the ligand containing 13 or more and 18 or less carbon atoms.

12. The method for manufacturing the display device according to claim 11, wherein the mixed solution forming step, the mixed solution dropping step, the phase separation step, the exposure step, and the patterning step are sequentially performed repeatedly for each of the mutually different colors of light.

13. The method for manufacturing the display device according to claim 11, wherein the phase separation step includes phase separation into the first hole transport layer and the quantum dot with the ligand preventing the hole transport material from being exposed to the light-emitting layer.

* * * * *